United States Patent [19]

Bismarck

[11] 4,450,371
[45] May 22, 1984

[54] SPEED UP CIRCUIT

[75] Inventor: Otto H. Bismarck, Fords, N.J.

[73] Assignee: RCA Corporation, New York, N.Y.

[21] Appl. No.: 359,434

[22] Filed: Mar. 18, 1982

[51] Int. Cl.$^3$ .................. H03K 5/12; H03K 19/017
[52] U.S. Cl. .................................. 307/475; 307/263;
307/264; 307/268
[58] Field of Search ............... 307/263, 264, 268, 279,
307/475

[56] References Cited

U.S. PATENT DOCUMENTS

| | | |
|---|---|---|
| 3,728,556 | 4/1973 | Arnell . |
| 3,801,831 | 4/1974 | Dame . |
| 3,969,719 | 7/1976 | Sirocka et al. .................. 307/475 |
| 4,023,050 | 5/1977 | Fox et al. ....................... 307/475 |
| 4,039,862 | 8/1977 | Dingwall et al. . |
| 4,045,691 | 8/1977 | Asano ............................. 307/264 |
| 4,314,166 | 2/1982 | Bismarck . |

*Primary Examiner*—John Zazworsky
*Attorney, Agent, or Firm*—Joseph S. Tripoli; George E. Haas; Henry I. Schanzer

[57] ABSTRACT

First and second low-ON-impedance switching transistors driven by complementary signals are connected between first and second outputs, respectively, and a first power terminal to which is applied a first voltage level. First and second high-ON-impedance load devices are connected between the first and second outputs, respectively, and a second power terminal to which is applied a second voltage level. The conduction paths of a first and a second normally non-conducting low-ON-impedance transistors are connected in parallel with the first and second load devices, respectively. A pulsing network is coupled between the first and second outputs and the control electrodes of the first and second low-ON-impedance transistors for, in response to the signal at one of the outputs making a transition from the second to the first level, momentarily turning-on the low-ON-impedance transistor connected to the other output and causing the signal at the other output to quickly make a transition towards the second level, and then turning-off the low-ON-impedance transistor.

7 Claims, 5 Drawing Figures

SPEED UP CIRCUIT

This invention relates to switching circuits which are particularly useful in level shift applications.

It is often necessary and/or desirable to operate different parts of an electronic system at different voltage levels. At the places where the different parts interface, they must be coupled to each other. However, the signals at the interfaces are not necessarily compatible. It is, therefore, often necessary to provide interface and level shift circuits which can render one part of the system compatible with the other.

For an interface or level shift circuit to be useful, it must be compatible with the other circuits of the system with respect to speed of operation, and minimization of power dissipation among other characteristics.

A circuit embodying the invention includes first and second low-ON-impedance transistors respectively connected in parallel with first and second relatively high impedance load means, where the first and second high impedance load means are respectively connected between first and second outputs and a power terminal. A low-ON-impedance transistor is momentarily turned-on during an input signal transition to generate an equivalent low impedance between its associated output and the power terminal and to cause the voltage at the output to quickly go to the voltage at the power terminal.

In the drawing.

In various of the FIGURES above, like reference characters denote like components, transistors of P-conductivity type are identified by the letter P followed by a reference numeral, and transistors of N-conductivity type are identified by the letter N followed by a reference numeral.

Figure 1:
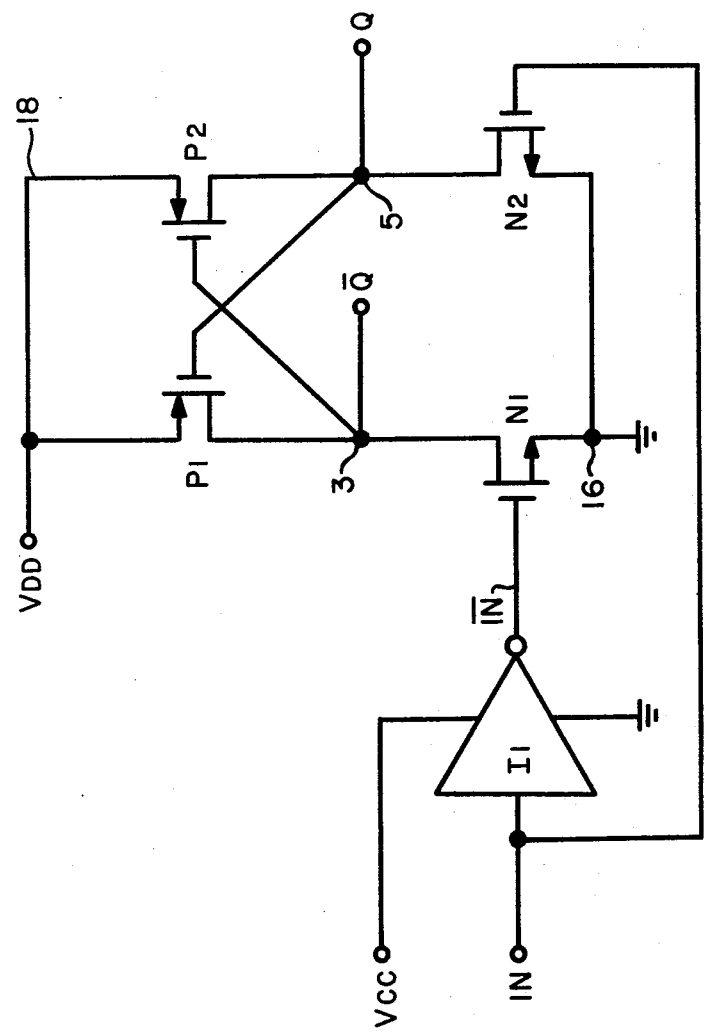
FIG. 1 is a schematic diagram of a prior art circuit.

The prior art level shift circuit shown in FIG. 1 includes an input inverter $I_1$ operated between a first potential of $V_{CC}$ volts and ground. In response to an input signal IN applied to its input, inverter $I_1$ produces a signal $\overline{IN}$ at its output. The complementary signals IN and $\overline{IN}$ are applied to the gates of transistors N1 and N2 which are the inputs of the two level shift inverters comprised of transistors N1, P1, and N2, P2. The sources of transistors N1 and N2 are connected to ground conductor 16. Cross-coupled transistors P1 and P2, which function as the load devices of the level shift inverters, have their conduction paths connected between a conductor 18 to which is applied a potential of $V_{DD}$ volts and the drains of transistors N1 and N2, respectively. The drains of transistors P1 and N1 are connected to output node 3 at which is produced output $\overline{Q}$, and the drains of transistors P2 and N2 are connected to output node 5 at which is produced output Q. The gate of transistor P1 is connected to the Q output and the gate of transistor P2 is connected to the $\overline{Q}$ output.

The potential $V_{DD}$ may be, typically, in the range of 5 to 15 volts and $V_{CC}$ may be, typically, in the range of 1.5 to 5 volts. In response to input signals IN and $\overline{IN}$, which vary between $V_{CC}$ volts and ground, output signals are produced at Q and $\overline{Q}$ which vary between $V_{DD}$ and ground.

Assume that IN, which was initially at $V_{CC}$ volts, goes low (i.e. from $V_{CC}$ volts to ground). This causes transistor N1 to be turned-on, and transistor N2 to be turned-off. However, the $\overline{Q}$ and Q outputs which were at $V_{DD}$ and ground, respectively, do not go immediately to ground and $V_{DD}$, respectively. When transistor N1 turns-on, transistor P1 is still turned-on and conducting. To guarantee switching of the level shift inverters, the ON-impedance of each P type transistor is made much greater than the ON-impedance of the associated N type transistor for the same bias conditions. This ensures that when transistor N1 (N2) turns-on, $\overline{Q}$ (Q) drops significantly below $V_{DD}/2$. However, the high-ON-impedance of the P type transistors slow the rise time of $\overline{Q}$ and Q, resulting in at least two significant problems.

$\overline{Q}$ going low and applied to the gate of transistor P2 turns it on. Current then flows through the conduction path of transistor P2, charging the capacitance associated with output node 5 and causing the Q output to rise towards $V_{DD}$. However, since transistor P2 is a high impedance device it takes a relatively long time to charge up the capacitance at node 5. Until node 5 is charged up to approximately $V_{DD}$, transistor P1 is on. Consequently, P1 is on during the transition period, during which time N1 is also turned-on. Hence, during the transition period, current flows through P1 and is conducted via turned-on transistor N1 to ground, resulting in undesired power dissipation.

Also due to the high-ON-impedance of the P transistors the rise and fall times of the output signals are unequal. The propagation delays from input to output are unequal for high-to-low and low-to-high transitions. In a typical case, one edge of the level shifted signal, say the rising edge, will have a relatively slow rise time and long propagation delay. However, the falling edge will have a relatively fast fall time and correspondingly short propagation delay. Such unsymmetrical circuit response introduces signal overlap between concurrent logic signals which changes their timing relationship. Timing changes between logic signals, particularly in the case of control signals or clock signals, has an adverse effect on system operation.

Thus, while the prior art circuit has many desirable features, it is relatively slow, dissipates a relatively large amount of power while switching from one state to another, and the rise and fall times are not symmetrical.

Figure 2:
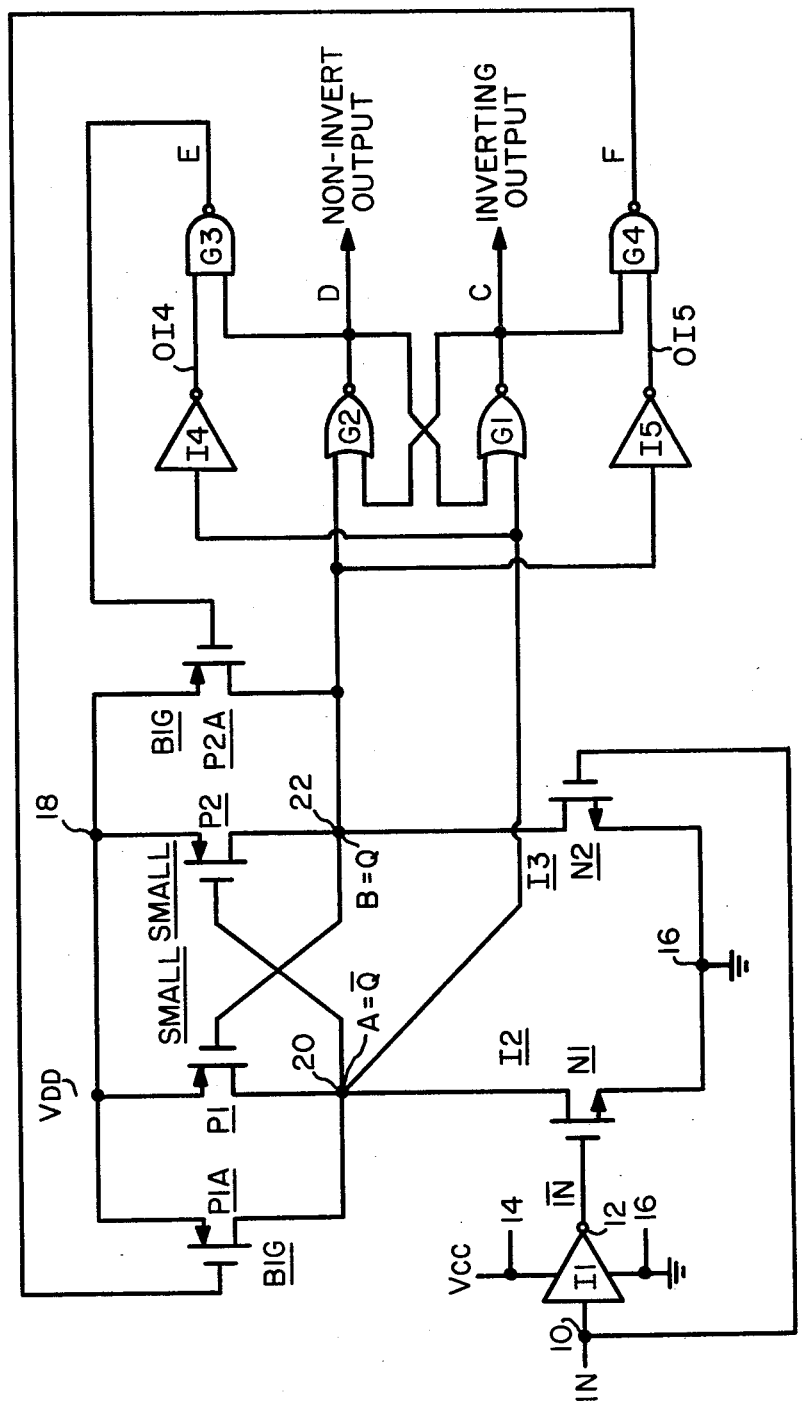
FIG. 2 is a schematic diagram of a level shift circuit embodying the invention.
Figure 4:
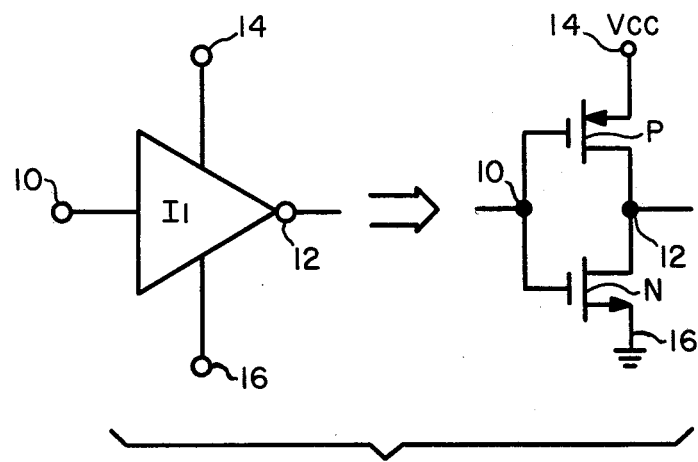
FIG. 4 is a block and schematic diagram of a prior art inverter circuit.

FIG. 2 illustrates an embodiment of the invention which includes an input inverter $I_1$ having an input terminal 10 to which is applied an input signal (IN), an output terminal 12 at which is produced a complementary signal $\overline{IN}$, and power terminals 14 and 16 to which are applied $V_{CC}$ volts and ground, respectively. Inverter $I_1$ may be a complementary inverter comprised of an N-type transistor and a P-type transistor as shown in FIG. 4 or it may be any one of a number of well known devices capable of inverting signals.

Two cross-coupled inverter means, I2 and I3, driven by signals $\overline{IN}$ and IN, respectively, produce level shifted output signals A($\overline{Q}$) and B (Q) which vary between ground and $V_{DD}$ volts. Inverting means I2 includes switching transistor N1 and load transistors P1 and P1A. Inverting means I3 includes switching transistor N2 and load transistors P2 and P2A. The gate of transistor N1 is connected to terminal 12. The gate of transistor N2 is connected to terminal 10. The drains of transistors N1, P1 and P1A are connected to output node 20 at which is produced output signal A($\overline{Q}$). The drains of transistors N2, P2 and P2A are connected to output node 22 at which is produced output signal B(Q). The sources of transistors N1 and N2 are connected to conductor 16 which is grounded. The source-to-drain paths of transistor P1 and P1A are connected in parallel between node 20 and a conductor 18 to which is applied $V_{DD}$ volts. The source-to-drain paths of transistors P2 and P2A are connected in parallel between conductor 18 and node 22. Transistors P1 and P2 are cross-coupled, i.e. the gate of transistor P1 is connected to output node 22, and the gate of transistor P2 is connected to output node 20.

As noted in FIG. 2, P1A and P2A are much larger devices than P1 or P2. Typically the ON-impedance of P1 or P2 is 30 times the ON-impedance of P1A or P2A and 100 times the ON-impedance of N1 or N2. It should be appreciated that the ratios of impedances can be varied greatly without departing from the teachings of the invention. Hence, for like values of forward bias, the ON-impedances of P1A and P2A are much lower than the ON-impedances of P1 and P2. As discussed below, transistors P1A and P2A are normally off being pulsed on momentarily by circuitry connected between nodes 20 and 22 and the gates of P1A and P2A. Also, the presence of P1A and P2A enable the ON-impedance of P1 and P2 to be made very small.

Node 20 is connected to one input of a two input NOR gate G1 while node 22 is connected to one input of a two input NOR gate G2. The output (C) of G1 is connected to the other input of G2 and the output (D) of G2 is connected to the other input of G1. As detailed below NOR gates G1 and G2 are cross-coupled to form a bistable flip-flop which functions as a memory means to store the past logic state of the input signal (IN). Node 20 is also coupled to the input of inverter I4 whose output (OI4 or $\overline{A}$) is applied to one input of two-input NAND gate G3. The output (D) of G2 is connected to the other input of G3 and the output (E) of G3 is connected to the gate electrode of P2A. In a similar manner, node 22 is connected to the input of an inverter I5 whose output (OI5 or $\overline{B}$) is applied to one input of a two-input NAND gate G4. The output C of G1 is connected to the other input of G4 and the output F of G4 is connected to the gate of P1A. The operating voltages applied to the elements G1, G2, G3, G4, I4 and I5 are $V_{DD}$ and ground whereby their outputs swing between these two voltages.

In the discussion of the operation of the circuit to follow, it is assumed that $V_{CC}$ is less than $V_{DD}$; and that signals IN and $\overline{IN}$ are switched between ground and $V_{CC}$.

The status of the circuit for the two possible steady state conditions (IN=low and $\overline{IN}$=High) will first be discussed, and it will be shown that for either steady state condition transistors P1A and P2A are turned-off. Assume, initially, that IN is high ($V_{CC}$ volts) and, consequently, that $\overline{IN}$ is low (ground). $\overline{IN}$ low causes transistor N1 to be turned-off and transistor P1 to be turned-on. When IN is high, transistor N2 is turned-on and the B output is at, or close to, ground potential (i.e. is low). B-low is applied to the gate of P1 keeping it turned-on. The conduction path of P1 presents a relatively low impedance between conductor 18 and terminal 20 in comparison to the OFF-impedance of N1 which permits no conduction through its source-drain path. P1 then couples the $V_{DD}$ volts at conductor 18 to node 20, via its conduction path, whereby A is high or $V_{DD}$ volts. A-high, applied to the gate of transistor P2 keeps it turned-off. A high applied to G1 causes C to be low. When A is High and B is low the output D of G2 is high since B and C are low.

A-high is applied to I4, whose output OI4 which is then low is applied to one of the two inputs of NAND gate G3. This causes the output E of G3 to be "high"; where the "high" is at $V_{DD}$ volts. Since E is equal to $V_{DD}$ and since this voltage is applied to the gate of P2A, P2A is turned-off. B low is applied to the input of I5, whose output, OI5, which is then high, is applied to one of the two inputs of NAND gate G4. However, the other input of NAND gate G4 is the "low" signal from output C. Hence, the output F of G4 is a "high" of $V_{DD}$ volts. F-high, applied to the gate of P1A, maintains P1A turned-off. Hence, in the steady state P1A and P2A are OFF and dissipate no power. The circuit conditions when IN is high are summarized in line I of Table 1 below.

When IN is low and $\overline{IN}$ is high, N1 is switched-on clamping output point 20 to ground [A is low] and N2 is turned-off. P2 is turned-on clamping output point 22 to $V_{DD}$ volts [B is high], and P1 is turned-off. Hence, IN is low, A is low and B is high. For the condition of A low and B high the output D of G2 is low and the output C of G1 is high. D-low applied to G3 causes its output E to be high. Concurrently, B-high applied to I5 causes its output OI5 to go low. This output is applied to G4 causing its output F to be high. Since E and F are high (at $V_{DD}$ volts) P1A and P2A are turned-off. Hence, in the steady state P1A and P2A are always off. The circuit conditions when IN is low are summarized in line II of Table 1 below.

TABLE 1

|     | IN | A  | B  | C  | D  | E  | F  |
|-----|----|----|----|----|----|----|----|
| I.  | HI | HI | LO | LO | HI | HI | HI |
| II. | LO | LO | HI | HI | LO | HI | HI |

The response of the circuit to the transient condition, when the input signal changes levels, will now be discussed. Assume that the input signal IN makes a transition from the low level (ground) condition to the high level ($V_{CC}$) condition. Subsequently, $\overline{IN}$ makes a transition from the high level ($V_{CC}$) condition to the low level (ground) condition.

As the IN signal rises from the ground towards $V_{CC}$ volts, it reaches a value equal to the threshold voltage $V_T$) of N2. N2 then turns-on and functions as a low impedance path sinking the current flowing into node 22 to ground conductor 16 causing the B output to go from $V_{DD}$ volts towards zero volts. The high-to-low transition at node 22 occurs rapidly [within one gate delay ($\tau_D$)] causing P1 to turn-on. Concurrently, the high-to-low transition of $\overline{IN}$ is directly applied to the gate of N1 cutting it off. This enables the current passed through P1 to charge node 20 towards $V_{DD}$. But, since P1 is a small device, the time to charge node 20 to, or close to, $V_{DD}$, is very long compared to the time needed to discharge node 22 to ground. Hence, the A output remains close to ground. As a result both nodes A and B will be at or close to ground following a low-to-high transition of IN.

Figure 3:
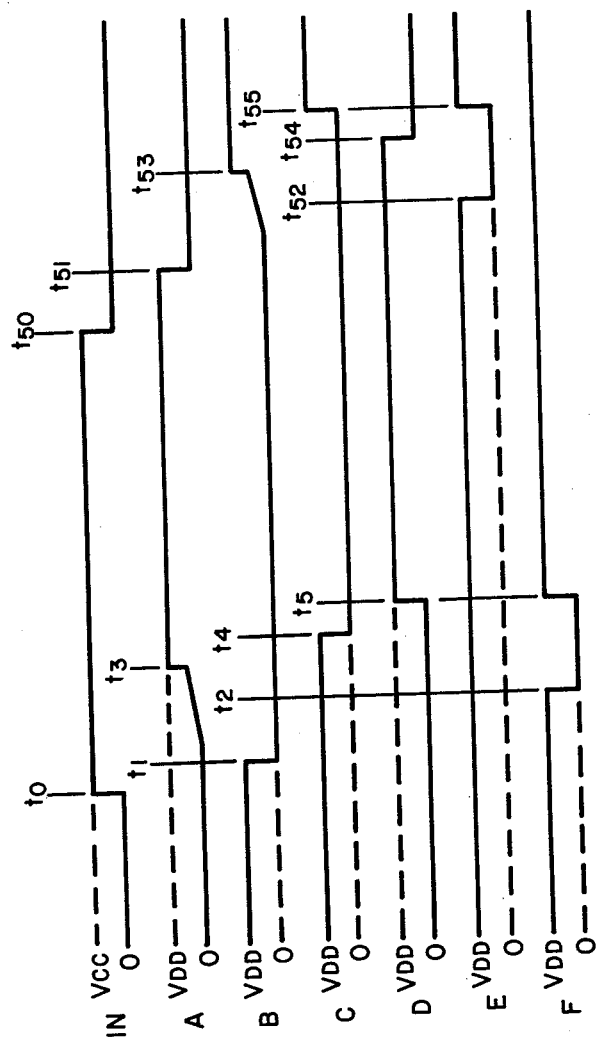
FIG. 3 is a diagram of waveforms associated with the circuit of FIG. 2.

The sequence of events during the transient period following a transition is best explained with reference to FIG. 3. Following the low-to-high transition of IN at time $t_o$, B goes low at time $t_1$ (A remains at, or close to, the low level until time $t_3$ for reasons discussed below). B-low is applied to one input of G2 but has no immediate effect on its output. G1–G2 function to store the past condition of IN. However, B-low is also applied to I5 causing OI5 to go high aproximately two gate delays after IN went high. OI5 is applied to G4 whose other input C is already high. Since its two inputs are high, the output F of G4 goes from high ($V_{DD}$)-to-low (ground) at time $t_2$ (approximately 3 gate delays after IN went high). F-low is applied to the gate of P1A and turns-it-on. As soon as P1A turns-on, it clamps node 20 to $V_{DD}$ via its low-ON-impedance path, and very quickly raises node 20 to $V_{DD}$ volts at time $t_3$. As soon as A goes high, P2 is turned-off, the output OI4 is driven low, and the output C of G1 is driven low, at time $t_4$. When C goes low, the output F of G4 returns to the high level (since OI5 is high), at time $t_5$. As soon as F reaches, or comes close to, $V_{DD}$ volts the turn-on pulse to P1A is terminated and P1A is turned-off. Concurrently, since B is low and since C has been driven low, the two inputs to gate G2 are now low and its output, D, goes high, also at time $t_5$. D goes high at time $t_5$, but note that A went high at time $t_3$ and OI4 went low about time $t_4$. OI4 low maintains the output E of G3 at a high level. Hence, it has been shown that P1A was pulsed ON for a very brief period following an input signal transition. The length of the period is controlled by the time it takes A to be driven to the high level. By making P1A (and P2A) large, the period, although brief, is sufficiently long to quickly establish the desired high level condition at the (slow) output node (A).

The circuit behaves in a similar manner when the input signal (IN) makes a negative going (high-to-low) transition at time $t_{50}$. As $\overline{IN}$ goes low, IN goes high. N2 is turned-off and N1 is turned-on. Output A goes to ground (low) relatively quickly at time $t_{51}$. P2 is turned-on; but since P2 is a small device it is incapable of quickly charging node B to $V_{DD}$ and the low B output at node 22 persists. The high-to-low transition of output A is applied to I4 whose output OI4 goes from low-to-high approximately 3 gate delays after IN went low. OI4 is applied to one input of G3 whose other input is D which was high and remains high (since the state of the flip-flop (G1–G2) has not changed). Hence, following the positive transition of OI4 the output E of G3 is driven from $V_{DD}$ to ground at time $t_{52}$. As soon as E goes to ground, P2A is turned-on and quickly drives node B to, or close to, $V_{DD}$ volts at time $t_{53}$. After B is driven high (to $V_{DD}$) it causes the output D of G2 to go low (be driven from $V_{DD}$ to ground) at time $t_{54}$. Hence, it is only after the two outputs A, B, have reached their steady state level that the state of the flip-flop (G1, G2) is changed to reflect the new steady state condition.

The low output at D applied to G3 causes its output E to be driven high to $V_{DD}$ volts at time $t_{55}$. This terminates the negative pulse generated at E and causes the turn-off of P2A. Concurrently with its effect on gate G3, D-low is applied to the other input of G1 whose two inputs (A and D) are now low. This causes C to be driven high also at time $t_{55}$ establishing the condition corresponding to IN low. Note that F remains high even though C is high because its other input (the output OI5 of I5) was set low when B was driven high at time $t_{53}$. Thus, it has been shown that the circuit functions to produce a pulse which turns-on a low-ON-impedance device for a very short period of time to quickly establish a desired condition at the outputs of the level shift circuit.

Figure 5:
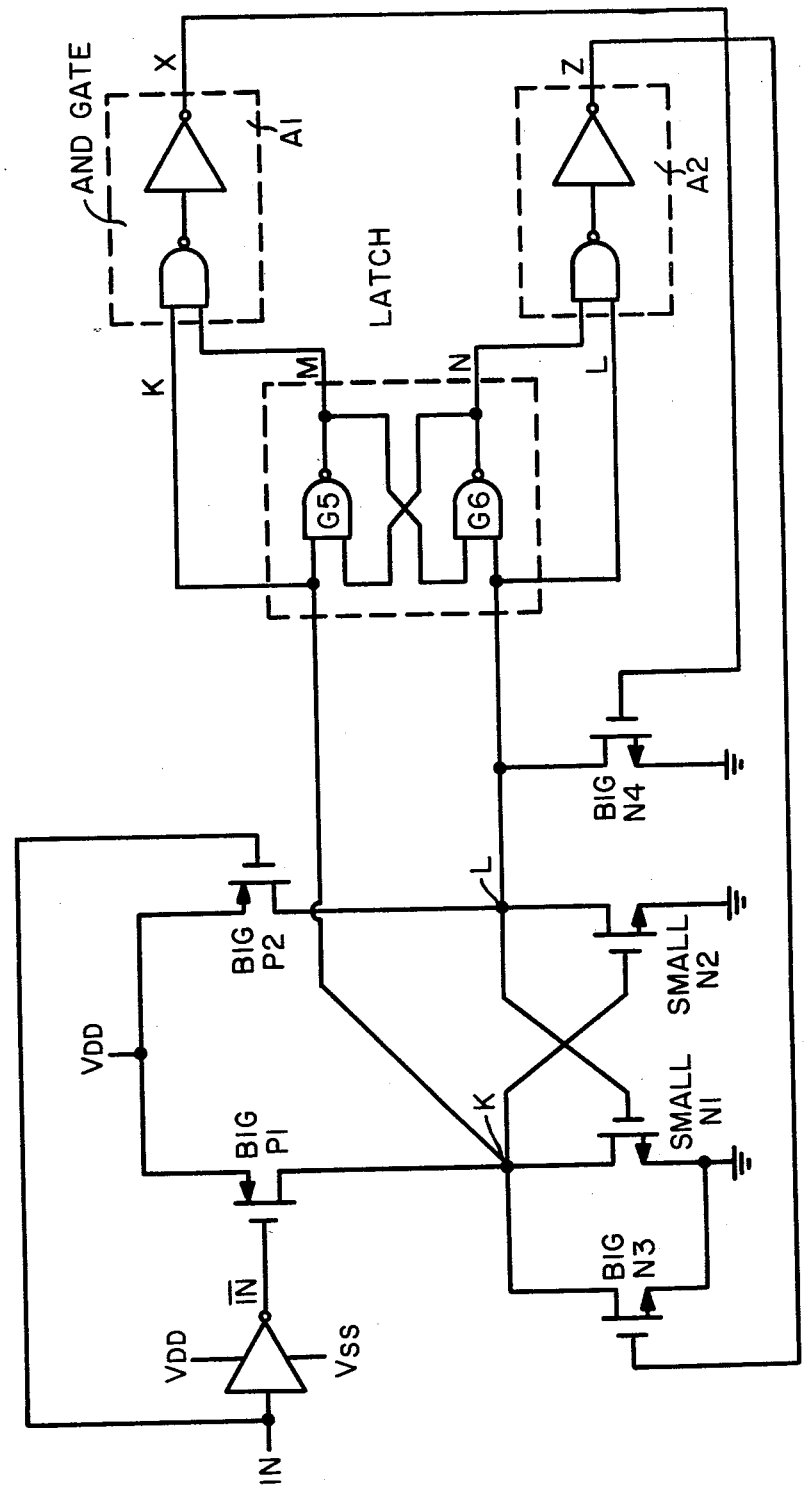
FIG. 5 is a schematic diagram of another circuit embodying the invention.

The circuit of FIG. 5 is a complementary version of the circuit of FIG. 2. Here the driving or switching transistors (P1, P2) are of P conductivity type and the cross-coupled load transistors (N1, N2) are of N conductivity type. Typically the ON-impedance of N1 or N2 is 100 times that of P1 or P2.

In the circuit of FIG. 5 the driving transistors (P1 or P2) can quickly charge an output node (K or L) to $V_{DD}$. However, the "small" load transistors (N1 or N2) cannot quickly discharge the output nodes to ground. Hence, after a signal transition one output (e.g. K) will be driven high while the other output (e.g. L) will remain at the high level, discharging towards the low level very slowly.

The speed of response of the circuit is increased by the addition of two large transistors N3, N4 whose conduction paths are connected in parallel with transistors N1, N2, respectively. Typically, the ON-impedance of N1 or N2 is 30 times that of N3 or N4. The turn-on and turn-off of N3 and N4 is controlled by circuitry which includes a bistable latch comprised of two-cross-coupled NAND gates (G5 and G6) and two "AND" gates A1 and A2 whose respective outputs X and Z are connected to the gate electrodes of N3 and N4. The two inputs to NAND gates G5 and G6 are the level shift outputs K and L. The two inputs to "AND" gate A1 are the K output and the M output of G5. The two inputs to "AND" gate A2 are the L output and the N output of G6.

As in the circuit of FIG. 2 transistors N3 and N4 are OFF during the steady state condition and only one of the two is turned-on momentarily following an input signal transition. For example, assume that initially (steady state condition) K is Low and L is High. Consequently, M is high, N is low, and X and Z are low. Assume now that the input signal (IN) makes a transition from low-to-high and $\overline{IN}$ goes from high-to-low. P1 is switched ON and K goes from low-to-high while L remains at, or close to, the high level. When K goes high and since M is already high, the X output goes high turning-on N4. The turn-on of N4 causes the output L to be quickly driven to ground (low). After L goes low, the output N goes high. Since N and K are now high, M is driven low. After M goes low X is driven low and N4 is turned-off. During all this time Z is low and N3 is turned-off. Thus, as in the circuit of FIG. 2 the use of N3 and N4 enable the speed of response of the circuit to be increased, and the K and L signal outputs to be much more symmetrical with relatively sharp rising and falling edges. This enables the repetition rate of the circuit to be fast. The operation of the circuit of FIG. 5 is complementary but otherwise similar to that of FIG. 2 and need not be further detailed.

Thus, after an input signal transition when K and L are both high, a "large N" transistor (e.g. N3) is turned-on momentarily to help its associated "small" N transistor (e.g. N1) make the level shift circuit change state quickly. As soon as the transition from high-to-low at the output (e.g. K) is completed, or nearly completed, the large N transistor is turned-off. Note that it is the large transistor which creates the condition detected by the gating circuitry for terminating its ON period. As noted above a significant advantage of the use of large devices N3 and N4 in parallel with the high impedance load devices N1, N2 is that the input signal can have a much higher repetition rate. That is, the circuit can respond quickly since its nodes are quickly driven to steady state conditions.

It should be appreciated that the circuitry coupled between the outputs (A and B, or K and L) of the level shift circuit and the gate electrodes of the low-impedance load devices (P1A and P2A or N3 and N4) could be replaced by other suitable pulse forming network which includes a memory element to store the past steady steady condition at the two outputs and which is responsive to the two signals having the same binary value [in the case of FIG. 2 both signals (A and B) being low, in the case of FIG. 5 both signals (K and L) being high] to determine which one of the two large (i.e. low impedance) load devices should be pulsed on.

What is claimed is:

1. The combination comprising:
   first and second power terminals for the application thereto of first and second operating potentials, respectively;
   first and second input terminals for the application thereto of complementary input signals;
   first and second outputs at which are produced output signals in response to said input signals;
   first and second switching transistors, each having a conduction path and a control electrode;
   means connecting the conduction paths of said first and second transistors between said first and second outputs, respectively, and said first power terminal;
   means connecting the control electrodes of said first and second transistors to said first and second input terminals, respectively;
   third, fourth, fifth and sixth transistors each having a conduction path and a control electrode; said third and fourth transistors, when turned-on, having a much higher impedance than the ON-impedance of said first, second, fifth and sixth transistors;
   means connecting the conduction paths of said third and fifth transistors in parallel between said first output and said second power terminal;
   means connecting the conduction paths of said fourth and sixth transistors in parallel between said second output and said second power terminal;
   means coupling the control electrode of said third transistor to said second output and the control electrode of said fourth transistor to said first output; and
   means responsive to the signal at said first and second outputs coupled to the control electrodes of said fifth and sixth transistors for momentarily turning-on the fifth transistor and maintaining the sixth transistor turned-off when said second transistor is initially turned-on; and for momentarily turning-on the sixth transistor and maintaining said fifth transistor turned off when said first transistor is initially turned-on.

2. The combination as claimed in claim 1 wherein said transistors are insulated-gate field-effect transistors (IGFETs).

3. The combination as claimed in claim 2 when said first and second transistors are of one conductivity type and said third, fourth, fifth and sixth transistors are of opposite conductivity type.

4. The combination as claimed in claim 1 wherein said means responsive to the signal at said first and second outputs includes means responsive to a signal at one of said first and second outputs making a transition from a voltage level approximately equal to that at said second power terminal to a voltage level approximately equal to that at said first power terminal for turning-on that one of said fifth and sixth transistor connected to the other one of said first and second outputs and rapidly charging said other one of said first and second outputs to, or close to, the voltage level at said second power terminal; and
   wherein said means responsive to the signal at said first and second outputs includes means responsive to the signal at said other one of said first and second outputs being charged to said second power terminal and said one of said first and second outputs being charged to the voltage at said first power terminal for turning-off said one of said fifth and sixth transistors.

5. The combination as claimed in claim 1 wherein said means responsive to the signal at said first and second outputs includes:
   a bistable flip-flop comprising first and second cross-coupled NOR gates; wherein said first output is connected to one input of said first NOR gate and wherein said second output is connected to one input of said second NOR gate;
   wherein the output of said first NOR gate and the complement of the signal at said second output are applied to a first two-input NAND gate; and wherein the output of said first NAND gate is connected to the control electrode of said fifth transistor; and
   wherein the output of said second NOR gate and the complement of the signal at said first output are applied to a second two input NAND gate and wherein the output of said second NAND gate is connected to the control electrode of said sixth transistor.

6. In a circuit in which first and second switching transistors driven by complementary input signals have their conduction paths connected between first and second outputs, respectively, and a first power terminal, and in which relatively high impedance loads are connected between the outputs and a second power terminal, whereby the signals at said outputs are unsymmetrical going from a second level, approximately equal to the voltage at said second power terminal, to a first level, approximately equal to the voltage at said first power terminal, much faster than from said first level to said second level, means for rendering the signal at said first and second outputs more symmetrical, comprising:
   first and second normally non-conducting load transistors, each load transistor having a conduction path and a control electrode, and the load transistors when turned-on exhibiting a relatively low impedance along their conduction paths;
   means connecting the conduction path of said first load transistor between said first output and said second power terminal,
   means connecting the conduction path of said second load transistor between said second output and said second power terminal; and
   means, coupled between said first and second outputs and the control electrodes of said first and second load transistors, responsive to the signal at said first output making a transition from said second level to said first level for turning-on said second load transistor for quickly charging said second output from said first level to said second level, and responsive to the signal at said second output being charged to said second level and the signal at said first output being at said first level for turning-off said second load transistor.

7. In a circuit in which first and second switching transistors driven by complementary input signals have their conduction paths connected between first and second outputs, respectively, and a first power terminal, and in which relatively high impedance loads are connected between the outputs and a second power terminal, whereby the signals at said outputs are unsymmetrical going from a second voltage level, approximately equal to the voltage at said second power terminal, to a first voltage level, approximately equal to the voltage at said first power terminal, much faster than from said first level to said second level, means for rendering the signal at said first and second outputs more symmetrical, comprising:

first and second normally non-conducting load transistors, each load transistor having a conduction path and a control electrode, and the load transistors when turned-on exhibiting a relatively low impedance along their conduction paths;

means connecting the conduction path of said first load transistor between said first output and said second power terminal;

means connecting the conduction path of said second load transistor between said second output and said second power terminal; and means, coupled between said first and second outputs and the control electrodes of said first and second load transistors, responsive to the signal at one of said first and second outputs making a transition from said second level to said first level for turning-on the load transistor connected to the other one of said first and second outputs and quickly charging said other output from said first level towards the level at said second power terminal, and responsive to the signal at said other output being charged to approximately the level at said second power terminal and the signal at said one output being approximately equal to the level at said first power terminal for turning-off said load transistor connected to the other one of said first and second outputs.

* * * * *

UNITED STATES PATENT AND TRADEMARK OFFICE
CERTIFICATE OF CORRECTION

PATENT NO. : 4,450,371

DATED : May 22, 1984

INVENTOR(S) : Otto Herbert Bismarck

It is certified that error appears in the above-identified patent and that said Letters Patent is hereby corrected as shown below:

Col. 4, line 22, change "$\overline{IN}$is" to - - - $\overline{IN}$ is - - -.

Col. 4, line 45, change "Subsequently" to - - - Consequently - - -.

Col. 4, line 51, change "$V_T$)" to - - - $(V_T)$ - - -.

Signed and Sealed this

Eighteenth Day of December 1984

[SEAL]

Attest:

*Attesting Officer*

GERALD J. MOSSINGHOFF

*Commissioner of Patents and Trademarks*